United States Patent
Bushnell et al.

[19]

[11] Patent Number: 6,131,181
[45] Date of Patent: Oct. 10, 2000

[54] METHOD AND SYSTEM FOR IDENTIFYING TESTED PATH DELAY FAULTS

[75] Inventors: Michael Bushnell, East Windsor, N.J.; Marwan A. Gharaybeh, Sunnyvale, Calif.; Vishwani D. Agrawal, New Providence, N.J.

[73] Assignee: Rutgers University, Piscataway, N.J.

[21] Appl. No.: 08/955,413

[22] Filed: Oct. 23, 1997

Related U.S. Application Data
[60] Provisional application No. 60/029,068, Oct. 23, 1996.

[51] Int. Cl.[7] ........................................ G06F 17/50
[52] U.S. Cl. ................................. 716/4; 716/6; 703/13; 703/19
[58] Field of Search ....................... 395/500.05, 500.07, 395/500.34, 500.35, 500.4, 500.06, 500.36; 716/4, 6, 5; 703/13, 14, 15, 19

[56] References Cited

U.S. PATENT DOCUMENTS
4,656,592  4/1987  Spaanenburg et al. .
5,422,891  6/1995  Shaik et al. .

OTHER PUBLICATIONS

Gharaybeh et al., "The Path–Status Graph w/Application to Delay Fault Simulation," IEEE Trans. on CAD of Integrated Circuits and Systems, pp 324–332, 1998.

Gharaybeh et al., "An Exact Non–Enumerative Fault Simulation for Path–Delay Faults," IEEE Int'l Test Conference, pp 276–285, 1996.

I. Pomeranz and S.M. Reddy. "An Efficient Non–Enumerative Method to Estimate Path Delay Fault Coverage". In Proc. ICCAD, pp. 560–567, Nov. 1992.

I. Pomeranz, L.N. Reddy and S.M. Reddy, "SPADES: A simulator for Path Delay Faults in Sequenctial Circuts". In Proc, Euro–DAC, pp. 428–435. Sep. 1992.

S. Bose, P. Agrawal and V.D. Agrawal. "Path Delay Fault Simulation of Sequential Circuts".IEEE Trans. on VLSI Systems, 1(4):453–461, Dec. 1993.

B. Kapoor. "An Efficient method for Computing Exact Path Delay Fault Coverage". In Proc. Euro–DAC, pp. 516–520, Mar. 1995.

M.A. Gharaybeh, M.L. Bushnell and V.D. Agrawal. "Parallel Pattern Concurrent Fault Simulation of Path–Delay Faults with Single–Input Change Tests". In Proc. 9th Int. Conf. on VLSI Design, pp. 426–431, Jan. 1996.

M.K. Srinivas, M.L. Bushnell and V.D. Agrawal. "Flags and Algebra for Sequential Circut VNR Path Delay Fault Test Generation". In Proc. 10th Int. Conf. on VLSI Design, pp. 88–94, Apr. 1996.

J. L.Carter, V.S. Lyengar, and B. K. Rosen. "Efficient Test Coverage Determination for Delay Faults". IBM Thomas J. Watson Research Center, Yorktown Heights, NY,. no pg # or date.

G.L. Smith. "Model for Delay Faults Based Upon Paths". In Proc. ITC, pp. 342–349, Nov. 1985.

C.J. Lin and S.M. Reddy. "On Delay Fault Testing in Logic Circuits". IEEE Trans. on CAD, 6(5):694–703, Sep. 1987.

M.H. Schulz, F. Fink, and K. Fuchs. "Parallel Pattern Fault Simulation of Path Delay Faults". In Proc. 26th DAC, pp. 357–363, Jun. 1989.

*Primary Examiner*—Paul R. Lintz
*Assistant Examiner*—Leigh Marie Garbowski
*Attorney, Agent, or Firm*—Mathews, Collins, Shepherd, & Gould, P.A.

[57] ABSTRACT

The present invention relates to a method and system for identifying tested path-delay faults in integrated circuits. A path status graph is generated to represent the detected status of simulated path-delay faults. The path status graph includes vertices representing primary inputs, primary outputs and elements of the circuit. Detected status path-delay faults can be dynamically distributed to edges of the path status graph. Tested path-delay faults can be identified from traversal of the edges of the path status graph.

24 Claims, 10 Drawing Sheets

METHOD AND SYSTEM FOR IDENTIFYING TESTED PATH DELAY FAULTS

This application claims the benefit of U.S. Provisional application Ser. No. 60/029,068 entitled Exact Non-Enumeration Fault Simulator For Path-Delay Faults filed by Applicants on Oct. 23, 1996 hereby incorporated by reference into this application.

BACKGROUND OF THE INVENTION

1. Field of the Invention

This invention is related to a method and system for identifying path-delay faults in integrated circuits in which a path status graph is created to represent the status of each simulated path-delay fault of the circuit.

2. Description of the Related Art

Increasing performance of integrated circuits can be achieved through operating the circuit at the highest possible speed. Operation of integrated circuits at high speeds increases the probability of failures of the chips fabricated with the circuit due to timing deviations. The timing deviations can be the result of manufacturing tolerances, design errors or incorrect statistical modeling of the timing behavior.

A logic circuit may be expected to operate correctly during successive "clock" periods. A "delay-fault" occurs when a circuit response requires more time than specified by design requirements. The delay of a digital circuit is the maximum time needed for outputs of the circuit to be determined after inputs to the circuit have changed. Signal transitions can travel through paths from primary inputs, gates or flip-flop outputs to primary outputs or flip-flop inputs of the circuit. For example, a path-delay fault (PDF) models when the cumulative delay of propagating a transition along a path of the circuit exceeds a predetermined limit. The predetermined limit can be a clock period. Delay-fault testing can be used to check if the circuit meets the required clock rate or speed requirements by detecting PDFs in the circuit.

An approach for modeling path-delay faults uses two path-delay faults for each path based on the direction of the transition, as described in G. L. Smith, *Model For Delay Faults Based upon Paths,* In Proc. ITC, pages 342–349, November 1985. The two path-delay faults are defined as rising and falling PDFs. This model directly represents the timing intent of the circuit.

Conventionally, delay-fault testing is performed with path-delay fault simulators. The path-delay fault simulators provide fault detection of a circuit with respect to a given test set. The simulators can be integrated into automatic test-pattern generation tools for providing the test set. Typically, the path-delay fault simulators store the status of the targeted faults in a data structure. During the course of simulation, the status is "true" if the fault is tested by the patterns simulated thus far, otherwise the status is "false".

Conventional approaches use one location to store the status of each fault at the beginning of the simulation, see: S. Bose, P. Agrawal and V. D. Agrawal, *Path Delay Fault Simulation of Sequential Circuits,* IEEE Trans. on VLSI Systems, 1(4):453:461, December, 1993; I. Pomeranz, L. N. Reddy and S. M. Reddy, *SPADES: A Simulator For Path Delay Faults in Sequential Circuits,* In Proc. Euro-DAC, pages 428–435, September 1992, and G. L. Smith, *Model For Delay Faults Based Upon Paths,* In Proc. ITC, pages 342–349, November 1985. Alternatively, an approach described in B. Kapoor, *An Efficient Method For Computing Exact Path Delay Fault Coverage,* In Proc. European Design and Test Conference, pages 516–520, March 1995 uses a tree data structure in which memory locations are dynamically allocated for tested faults during the course of simulation. In this approach, implicit enumeration of paths is represented as the tested paths which are consecutively numbered using one leaf node. If the tested paths do not have consecutive numbers, the number of leaf nodes is also proportional to the number of tested paths. In another approach, described in M. H. Schulz, F. Fink and K. Fuchs, *Parallel Pattern Fault Simulation of Path Delay Faults,* In Proc. 26th DAC, pages 357–363, June 1989, the number of leaf nodes is proportional to the number of tested paths. Since the number of paths in a circuit can be very large, the number of targeted faults may also be large. The above-described approaches have the drawback that with finite storage space and computational effort, it is likely that the above approaches will be impractical for circuits with large numbers of paths.

A non-enumerative data structure that grows polynomially with the circuit size is described in I. Pomeranz and S. M. Reddy, *An Efficient Non-Enumerative Method To Estimate Path Delay Fault Coverage,* In Proc. ICCAD, pages 560–567, November 1992. This approach provides an estimate of the fault coverage in which the accuracy improves as the degree of the polynomial is increased. This method has the limitation that it is exact only when the degree of the polynomial is proportional to the circuit size, resulting in exponential complexity.

It is desirable to provide a method and system for efficiently simulating path delay faults.

SUMMARY OF THE INVENTION

Briefly described, the present invention relates to a method and system for testing digital circuits in which path-delay faults (PDFs) are simulated without enumeration of all paths of the circuit. The method and system of the present invention can be used for identifying a large number of PDFs in a circuit having a large number of paths. For example, using one thousand random test pairs, all $10^{20}$ PDFs in the circuit c6288 were simulated and 4.4 billion of these faults were detected.

In the method and system of the present invention a path-status graph (PSG) is used to represent the status of each PDF in the circuit during logic simulation of the circuit. The circuit can be a combinational or sequential circuit. The status relates to whether or not the PDF is tested in the simulation. The PSG can be extracted from a circuit diagram of the circuit. Preferably, the initial PSG for combinational circuits, before detection of a PDF, includes a representation as a vertex in the PSG of primary inputs, primary outputs and logic gates having more than one fan-out. Since gates having a single fan-out are not represented in the initial PSG, the PSG has an initial upper bound equal to the number of nodes and the number of lines in the circuit under test. A circuit line is an individual wire in the circuit Edges between the vertices in the PSG correspond to paths or subpaths in the circuit diagram. Flags are set on the edges of the PSG to represent the status of tested PDFs. The status of a PDF is "true" if all edges along a corresponding path of a circuit PDF are tested. The status of a PDF is "false" if any edges along a corresponding path of the circuit are not tested. The detection status of PDFs which are simulated is dynamically distributed in the PSG using status flags attached to edges of the PSG. A plurality of delay test pattern pairs are used in the simulation to test the PDFs. Preferably, the status flags represent when the PDF is tested by either the previous delay test pattern pair, the current delay test pattern pair or both the previous and current delay test pattern pairs. Status flags are updated to represent that a fault tested in the current iteration is, for all subsequent iterations, considered as tested by previous delay test pattern pairs. Fan-out structure of the circuit is retained completely or partially in the PSG, thereby allowing the status flag of an edge to be shared by an exponential number of PDFs. The sharing of status flags by a plurality of PDFs provides the efficiency of the PSG.

It has been shown that during a simulation of the PDF, a simulation error can occur in the PSG for certain circuits, thereby resulting in the PSG not satisfying an exactness criterion. Simulation error can be eliminated by splitting selected vertices in the PSG so that the PSG satisfies the exactness criterion. When a vertex is split, a part of the reconverging fan-out structure is duplicated. The vertices that were split can be recombined for eliminating the duplicated part of the fan-out structure and reducing the PSG to a minimum. Iterations of the PDF simulation are performed in which each iteration corresponds to a test pattern pair simulation. Preferably, in each iteration logic simulation is performed using an algebra suitable for a selected PDF detection criterion. For example, the PDF detection criterion can be robust or non-robust testing. At the end of the simulation, the tested PDFs can be determined from a backward traversal of the PSG.

The method and system of the present invention have the advantage that a circuit can be accurately and efficiently tested for PDFs without conventional tracing of entire paths and marking of the paths.

The invention will be more fully described by reference to the following drawings.

DETAILED DESCRIPTION OF THE INVENTION

During the course of this description like numbers will be used to identify like elements according to the different figures which illustrate the invention.

Figure 1:
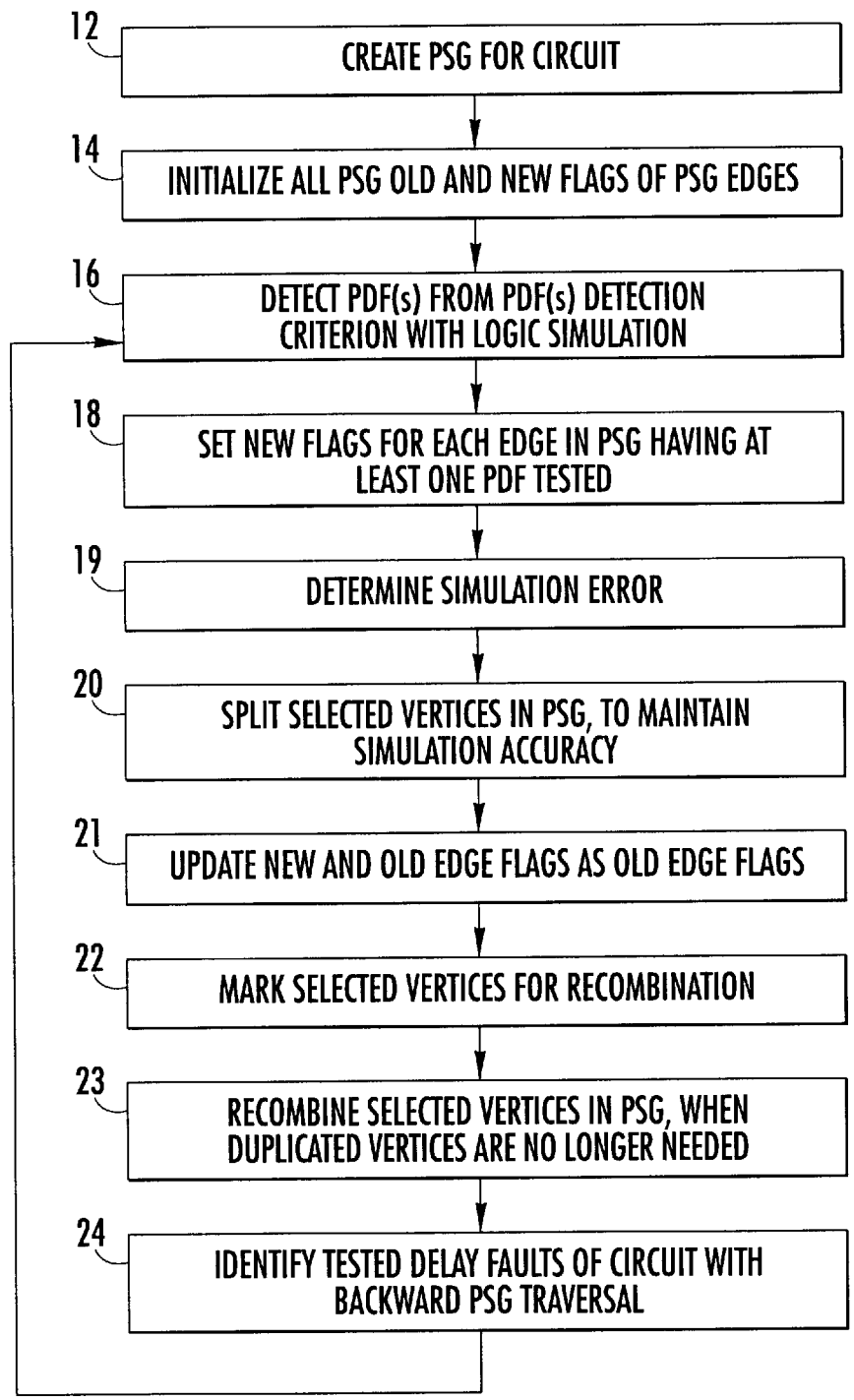
FIG. 1 is a flow diagram of the method and system for identifying path delay faults (PDFs) in accordance with the principles of the present invention.

FIG. 1 is a flow diagram illustrating the basic concept of a method and system for identifying path delay faults of an integrated circuit 10 in accordance with the principles of the present invention. The integrated circuit can be a combinational or a sequential or a circuit. A combination circuit output depends only on the current value of the input. A combinational circuit is composed of a number of "simple" gates. For example, the "simple" gates can be AND gates, OR gates, NOT gates, NAND gates and NOR gates. The combinational circuit can also include functions such as the exclusive OR function (XOR). The XOR function can be modeled using the "simple" gates. A sequential circuit is a logic circuit which includes memory. Output of the sequential circuit depends not only on the present value of the input but also on the input's previous values. A flip-flop can be used as a digital memory element in the sequential circuit.

A controlling value is defined as an input signal value applied to an input of a gate that uniquely determines the output value of the gate independently of other input values applied at other inputs to the gate. A non-controlling value is defined as an input signal value of a gate that does not uniquely determine the output value independently of the other input values. For example, for an AND gate "0" is the controlling value and "1" is the non-controlling value.

A path in a circuit is defined as a single path starting from a primary input of the circuit and ending at a primary output of the circuit. A sub-path is defined as a path in the circuit which does not either start from a primary input and/or end at a primary output. The parity of the path is defined as the number of inversions along the path modulo-2.

Block 12 creates a path-status graph (PSG) for a circuit to be tested. The PSG is determined from a circuit diagram of a circuit under test for at least one path-delay fault (PDF). The PSG is a data structure for holding the identification status of the PDFs in the circuit under test. The PSG is formed of vertices connected by edges. The vertex represents a primary input, primary output or element of the circuit. Preferably, in a combinational circuit a vertex represents a primary input, primary output or a gate with more than one fan-out. An edge is defined as a representation in the PSG of a path or a subpath of the circuit which does not have a fan-out. Preferably, in a sequential circuit, the vertex represents a primary input, primary output, flip-flop input or flip-flop output.

Figure 2A:
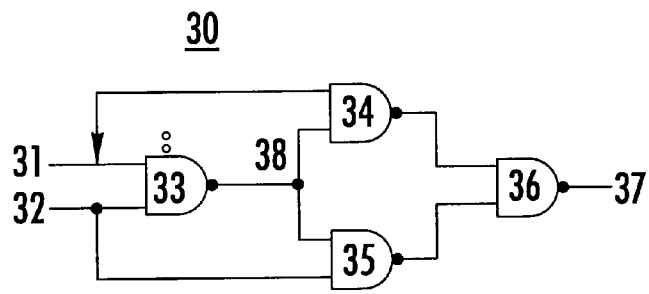
FIG. 2A is a circuit diagram of an exclusive OR function.
Figure 2B:
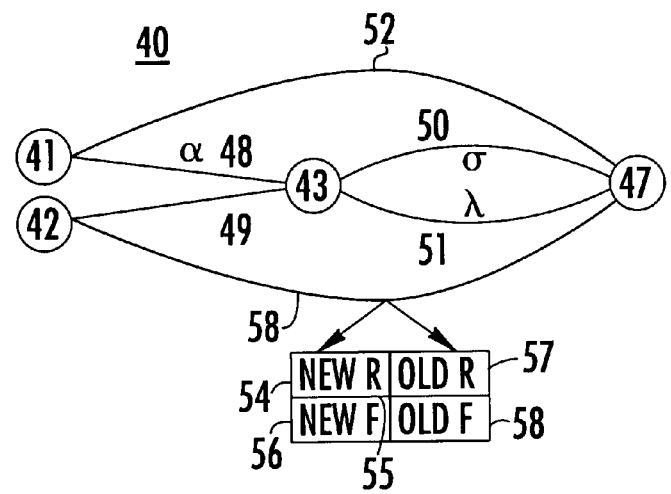
FIG. 2B is a path status graph (PSG) of the circuit diagram shown in FIG. 2A.

The creation of a PSG is from a circuit diagram is illustrated in FIGS. 2A and 2B. The circuit diagram includes all internal functional elements and all interconnections between the input and output terminals of the circuit under test. Preferably, the circuit diagram is a logic model contained in a computer memory. A node of a circuit diagram represents a primary input, primary output or element of the circuit.

A PSG status flag can be used with the PSG to represent the status of a PDF segment in the circuit. The status of a PDF is determined for a path or subpath in the circuit under test if all corresponding edges in the PSG have been tested by a test set. The status of a path or sub-path of a circuit that has been tested is represented by "1" or "true". The status of a PDF is represented by "0" or "false" when all corresponding edges in PSG have not been tested by the test set. The status of a PDF can be defined as falling into one of the following categories:

1. PDF never tested
2. PDF tested by previous patterns
3. PDF tested by current patterns
4. PDF tested by previous and current patterns.

The above-described status of PDF faults is represented in a PSG with flags. These flags represent the tested status of a single edge in the PSG, and are attached to the edge. New$^r$ flag represents an edge of at least one PDF currently tested for a rising input transition applied to the source of the path or sub-path. New$^f$ flag represents an edge of at least one PDF currently tested for a falling input transition applied to the source of the path or sub-path. Old$^r$ flag represents an edge of at least one PDF previously tested for a rising input transition applied to the source of the path or sub-path. Old$^f$ flag represents an edge of at least one PDF previously tested for a falling input transition applied to the source of the path or sub-path.

In block 14, an initialization of PSG status flags for all edges in the PSG is performed. Preferably, new$^r$ flags, new$^f$ flags, old$^r$ flags and old$^r$ flags are set to "false". Blocks 16–23 represent simulation of the PSG.

In block 16, a PDF is detected using logic simulation for each edge in the PSG based on a PDF detection criterion. For example, the PDF detection criterion can be robust detection or non-robust detection. A delay test pattern pair can be used in non-robust and robust testing represented by $<v_1,v_2>$ ($v_1 \neq v_2$). The change to $v_2$ from $v_1$ induces transitions on circuit inputs which propagate to circuit outputs. After application of the test pattern pair, the outputs are sampled after a predetermined time interval corresponding to the maximum allowed circuit delay. A path delay fault test can be performed which is either non-robust or robust. As described in C. J. Lin and M. Reddy, *On Delay Fault Testing In Logic Circuits,* IEEE Trans. on CAD 6(5), pages 694–703, September 1987, a non-robust test guarantees detection of a single PDF in the circuit. A robust test guarantees detection of single and multiple faults in the presence of multiple PDFs.

The non-robust test can become invalid when there are multiple PDF's in the circuit. A PDF for which there exists a non-robust test is referred to as singly testable (ST). The conditions for a non-robust test are (i) a transistion is applied at the primary input of the target path or subpath and (ii) for each gate only the target path, all inputs other than those along the paths or subpaths have non-controlling values under $v_2$. Conditions for a robust test are the same as the above-described non-robust test conditions with the additional conditions. If the signal on the target path or subpath arrives at a single input as a transition from the non-controlling value to the controlling value, then all other inputs of the gate have no transitions or static hazards. It will be appreciated that other detection criteria can be used with the teachings of the present invention. Logic simulation is performed using an appropriate algebra suitable for the selected PDF detection criterion.

In block 18, new$^r$ flags and new$^f$ flags are set to "true" for every edge in the PSG through which there is at least one PDF tested by a delay test pattern pair. Using a single forward traversal of the circuit under test, for primary inputs and gates with more than one fan-out, a detection criterion is checked for the subpath of that node that ends at another node having a corresponding vertex in the PSG. The subpath corresponds to a specific edge or set of edges if the vertices are split of the PSG. New flags, new$^r$ flag 55 and new $^f$ flag 56 are set for all corresponding edges if the detection criteria is satisfied along an edge of the vertex by testing with a current test pattern pair. For example, if a rising transition is applied to an edge, $\alpha$, before a vertex, new$^r$ flag is set to "true" for edge, $\alpha$. New$^f$ flag is set to "true" for the edge, $\lambda$, after the vertex tested with the rising transition.

In block 19, simulation error is determined by establishing if the PSG satisfies an exactness criterion. Selected vertices in the PSG are split to maintain simulation accuracy thereby eliminating the simulation error, in block 20. In block 21, for example, new and old edge flags are updated as old edge flags since a PDF tested currently is considered tested by previous patterns for all subsequent patterns. New and old flags are updated by setting the old flag in each edge having the new flag set, then resetting the new flag. If new$^r$ flag and new$^f$ flag have been set as "true" and old$^r$ flag and old$^f$ flag are set as "false", old$^r$ flag and old$^f$ flag are updated as "true" and new$^r$ flag and new$^f$ flag are updated as "false".

In block 22, vertices having input edges with newly set old$^r$ flags or old$^f$ flags are marked for recombination. Selected vertices which have been marked for recombination can be recombined when split vertices are no longer needed in the simulation, in block 23. After block 23, a tested PDF represents paths or sub-paths having the old$^r$ flag and old$^f$ flag set in each of the corresponding edges in the PSG. Tested delay faults are determined with a backward PSG transversal, in block 24. Blocks 16–24 are repeated for applying another test pattern prior to a different PDF along different edges of the PSG.

FIG. 2A represents circuit diagram 30 for an XOR function. The XOR function is implemented with NAND gates 33, 34, 35 and 36. Primary input 31 is connected to NAND gate 33 and NAND gate 34. Primary input 32 is connected to NAND gate 33 and NAND gate 35. Primary output 37 is connected to NAND gate 36.

A path status graph (PSG) 40 corresponding to circuit diagram 30 is represented in FIG. 2B. For each primary input and primary output in circuit diagram 30, there is a corresponding vertex in PSG 40. Accordingly, vertex 41 corresponds to primary input 31, vertex 42 corresponds to primary input 32 and vertex 47 corresponds to primary output 37. An internal vertex in PSG corresponds to a gate with more than one fan-out. Accordingly, internal vertex 43 of PSG 40 corresponds to NAND gate 33 which has more than one fan-out. NAND gates 34, 35 and 36 do not have more than one fan-out and are not represented in PSG 40.

For each path or subpath through circuit diagram 30 an edge is represented in PSG 40. Accordingly, edge 48, $\alpha$, represents a subpath of circuit 30 from primary input 31 to NAND gate 33. Edge 49 represents a subpath of circuit 30 from primary input 32 to NAND gate 33. Edge 50 represents a subpath in primary circuit 30 from NAND gate 33 through NAND gates 34 and 36 to primary output 37. Edge 51, $\lambda$, represents a sub-path in circuit 30 from NAND gate 33 through NAND gates 35 and 36 to primary output 37. Edge 52 represents a path in circuit 30 from primary input 31 through NAND gates 34 and 36 to primary output 37. Edge 53 represents a path in circuit 30 from primary input 32 through NAND gates 35 and 36 to primary output 37. Since gates having one fan out are not represented in PSG 40, the number of vertices and the number of edges in PSG 40 have upper bounds that are respectively equivalent to the number of nodes and the number of lines between gates of circuit 30.

The above-described status of PDF faults is represented in PSG 40 with flags 54. New$^r$ flag 55 represents an edge of at least one PDF currently tested for a rising input transition applied to the source of the path. New$^f$ flag 56 represents an edge of at least one PDF currently tested for a falling input transition applied to the source of the path. Old$^r$ flag 57 represents an edge of at least one PDF previously tested for a rising input transition applied to the source of the path. Old$^f$ flag 58 represents an edge of at least one PDF previously tested for a falling input transition applied to the source of the path.

For example, in FIG. 2A, if the path between primary input 31, NAND gates 33, 35, 36 and primary output 37 with a rising primary input transition is tested by a current delay test pattern pair, new$^r$ ($\alpha$) flag 55 of edge 48 is set to "true". The application of a rising transition to primary input 31 of NAND gate 33 results in a falling transition from output 38 of NAND gate 33. To represent this result, new$^r$ ($\lambda$) flag 56 of edge 51 is set to "true". During simulation of all subsequent patterns, old$^r$ ($\alpha$) and old$^f$ ($\lambda$) are set to true since the PDF tested currently is considered as tested by previous patterns for all subsequent patterns.

Figure 3:
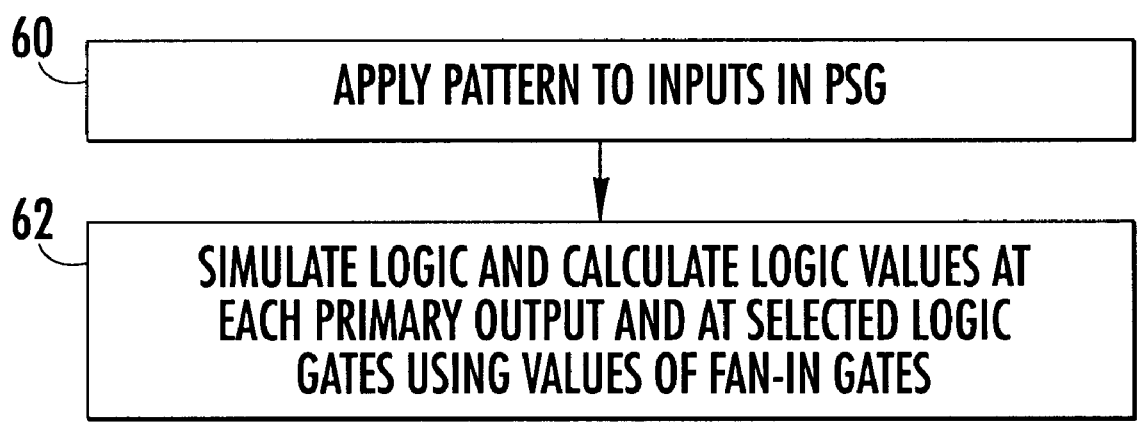
FIG. 3 is a flow diagram of a method for logic simulation of PDFs.

FIG. 3 illustrates a flow diagram of a method for logic simulation shown in 16. In this embodiment, a non-robust detection criterion is used. A test pair pattern is applied to inputs of nodes of circuit 30 having a corresponding edge in the PSG 40, in block 60. In block 62, logic values at each primary output and at selected gates having more than one fan-out are calculated from predetermined values of fan-in gates. The logic simulator simulates using the circuit schematic and the PSG, so circuit logic values are recorded in the schematic and path segment tested status is recorded in the PSG.

Modeling algebras can be used for simulating the circuit to be tested. For example, Chakraborty's 13-valued hazard modeling algebra can be used, as described in U.S. Pat. No. 5,422,891, to one of the inventors of this disclosure hereby incorporated by reference into this application. Other algebras that can be used in the present invention are: Augmented Smith Algebra, "Model for Delay Faults Based Upon Paths" Gordon L. Smith, IBM, Proceedings of the 1985 International Test Conference, pp. 342–349, 1985 and sixteen valued algebra described in M. A. Gharaybeh, M. L. Bushnell and Vishwani D. Agrawal, "*Parallel Concurrent Path Delay Fault Simulation Using Single-Input Change Patterns*", Proceedings of 9th International Conference on VSLI Design, Jan. 3–6, 1996, Bangalore, India.

Figure 4:
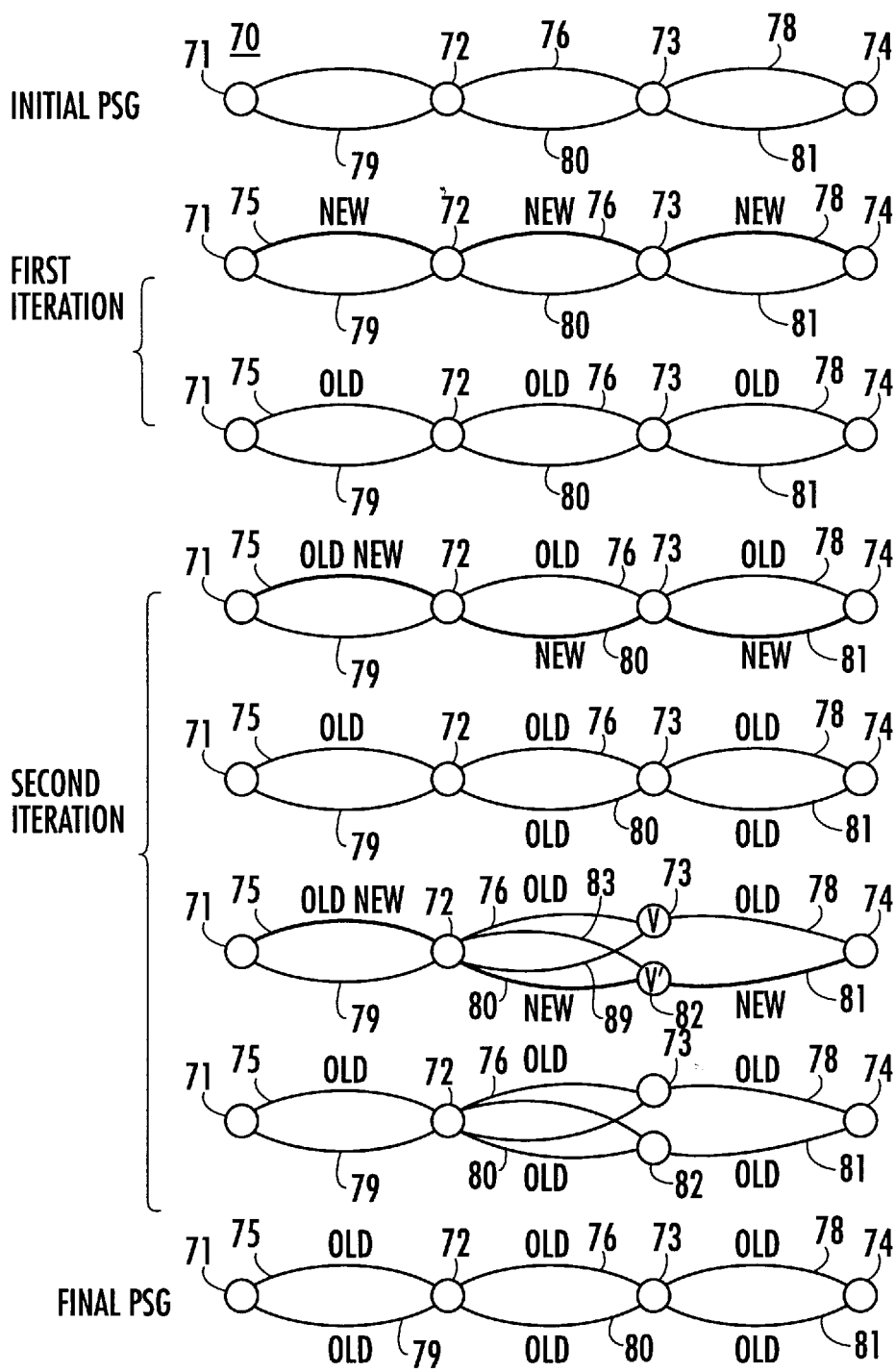
FIG. 4A is an initial PSG before detection of PDFs.
FIG. 4B is a PSG after testing of a first PDF.
FIG. 4C is a PSG after updating status flags for detection of the PDF in FIG. 2B.
FIG. 4D is a PSG after testing of a second PDF.
FIG. 4E is a PSG after updating status flags from detection of the PDF of FIG. 2D indicating simulation error.
FIG. 4F is a PSG after splitting of a vertex for testing the second PDF.
FIG. 4G is a PSG after updating of the status flags from detection of the PDF in FIG. 4F.
FIG. 4H is a PSG after recombination of vertices of FIG. 4G indicating all edges have been tested for PDFs.

FIGS. 4A–4H illustrate schematic diagrams of an example of the application of the method and system for identifying path delay faults of a circuit 10. FIGS. 4A–4E illustrate an example of a PSG simulation of a PDF using a PSG without selected vertex splitting as shown in blocks 19 and 20. It is shown that the PSG overestimates fault coverage when the status flags are set in block 18. In this case, simulation error occurs as the error from the overestimation of the fault coverage. FIGS. 4F–4H illustrate an example of a PSG simulation including splitting selected vertices for maintaining simulation accuracy and eliminating simulation error.

FIG. 4A illustrates a PSG 70 which has been created in block 12 and edge flags have been initialized in block 14. In this example, only the edge flags which are set to true are shown as a representative set of flags (old, new) instead of the above-described new$^r$ flag, new$^f$ flag, old$^r$ flag, and old$^f$ flags. PSG 70 has vertices 71, 72, 73 and 74. Between vertices 71 and 72 are edges 75 and 79. Between vertices 72 and 73 are edges 76 and 80. Between vertices 73 and 74 are edges 78 and 81.

FIG. 4B illustrates PSG 70 during a first iteration of blocks 16 and 18. A test pattern pair is applied to vertex 71. The test pattern pair traverses edges 75, 76 and 78 for testing a PDF between vertex 71 and 74. New flags are set to "true" for edges 75, 76 and 78.

In FIG. 4C during the first iteration, block 21 is performed for resetting new flags as "false" and updating old flags as "true". PSG 70 in FIG. 4C represents the PSG at the end of a first iteration without splitting or recombination.

In FIG. 4D, a second iteration of blocks 16 and 18 is performed applying another test pattern pair to a different PDF along edges 75, 80 and 81. FIG. 4E illustrates the PSG in the second iteration after block 21 is performed to update new flags and old flags. A back PSG traversal of the PSG of FIG. 4D by tracing the paths of the PSG that have the old flag set on all corresponding edges in block 24 determines four tested PDFs. The four tested PDFs derived from PSG 70 of FIG. 4E are along paths of respective edges 78, 76 and 75; edges 81, 80, 75; edges 78, 80 and 75 and edges 81, 76 and 75. Four tested PDFs is a simulation error. The correct number of PDFs tested is two since two pattern pairs were simulated and each test pattern pair detected one PDF. The difference between the identified number of PDFs and the exact number of PDFs is defined as the simulation error. The simulation error for FIG. 4E is two.

FIG. 4F in the second iteration illustrates PSG 70 after block 20 is performed for splitting vertex 73 after testing the path along edges 75, 80 and 81. Backtracing PSG 70 of FIG. 4G in the second iteration for determining tested PDF indicates two PDFs have been tested which are along edges 81, 80 and 75 and edges 78, 76 and 75 of PSG 70. The number of tested PDFs is two which is the correct number of tested PDFs with the simulation error being eliminated. FIG. 4H illustrates the final stage of the simulation after all the PDFs have been tested and after block 22 is performed for recombining previously split vertex 73. The size of the PSG in FIG. 4H is equal to the size of the PSG in FIG. 4A since all duplicated vertices have been recombined and the old flags have been set for all edges.

Figure 5:
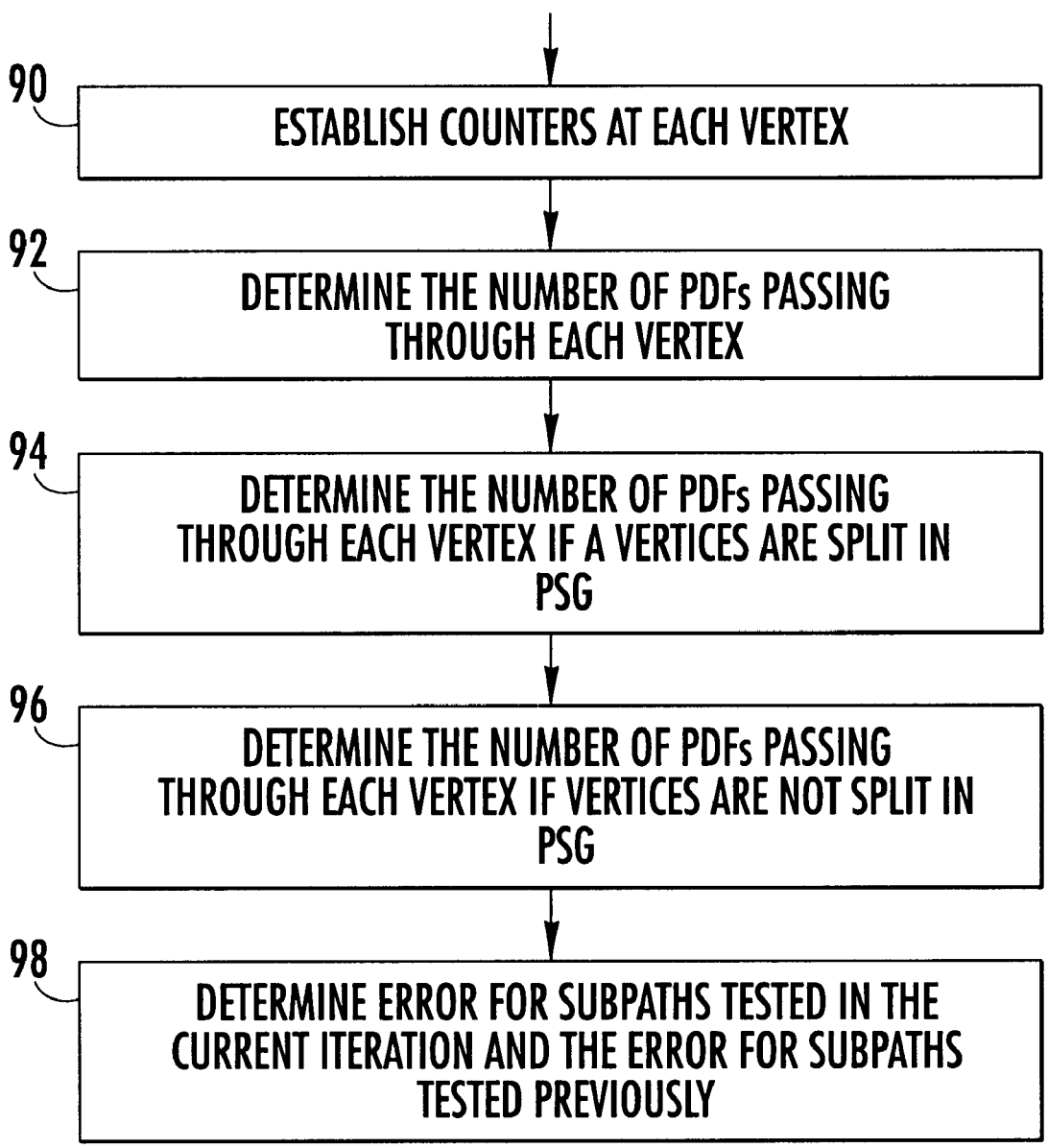
FIG. 5 is a flow diagram for determining simulation error.

FIG. 5 illustrates a method for determining simulation error in block 19. An exactness criterion of the PSG is satisfied when determined simulation error of the PSG is zero in an iteration during fault simulation performed in blocks 16–18. If the exactness criterion is satisfied, no vertices are split.

In block 90, for each vertex represented as v in a PSG, two sets of counters each having six members are established. The first set of counters is defined for PSGs having a rising transition at the circuit node corresponding to the vertex as $\{I^r_{old}, O^r_{old}, I^r_{new}, O^r_{new}, I^r_{both}, O^r_{both}\}$. The second set of counters is defined for PSGs having a falling transition at the circuit node as $\{I^f_{old}, O^f_{old}, I^f_{new}, O^f_{new}, I^f_{both}, O^f_{both}\}$ corresponding to the vertex. $I^r_{old}, I^f_{old}$ is defined as the number of subpaths starting from vertices corresponding to the primary inputs of the circuit under test and ending at vertex, v, such that every edge along a subpath has the old flag set to "true" after block 21 is executed. $O^r_{old}, O^f_{old}$ is defined as the number of subpaths starting from vertex, v, and ending at vertices corresponding to the primary outputs of the circuit under test such that every edge along a subpath has the old flag set to "true" after block 21 is executed. $I^r_{new}$, $I^f_{new}$ is defined as the number of subpaths starting from vertices corresponding to the primary inputs of the circuit under test and ending at the vertex, v, such that every edge along a subpath has the new flag set to "true" after block 21 is executed. $O^r_{new}, O^f_{new}$ is defined as the number of subpaths starting from vertex, v, and ending at vertices corresponding to the primary outputs of the circuit under test such that every edge along a subpath has the new flag set to "true" after block 21 is executed. $I^r_{both}$, $I^f_{both}$ is defined as the number of subpaths starting from vertices corresponding to the primary inputs of the circuit under test and ending at vertex, v, such that every edge along a subpath has both the old and new flags set to "true" after block 18 is executed. $O^r_{both}$, $O^f_{both}$ is the number of subpaths starting from vertex, v, and ending at vertices corresponding to the primary outputs of the circuit under test such that every edge along a subpath has both old and new flags set to "true" after block 18 is executed.

Vertices $\xi$ in the PSG are represented as v→$\xi$ when vertex, $\xi$, is at a level higher than vertex, v and as $\xi$→v when vertex, $\xi$, is at a level lower than vertex, v. If the edge v→$\xi$ or $\xi$→v has even parity corresponding to the number of inversions along the corresponding fan-out free circuit under test the relevant flags are {old$^r$, new$^r$} and the relevant counters are {$I^r_{old}$ ($\xi$) ... $O^r_{both}$ ($\xi$)}. If the edge v→$\xi$ or $\xi$→v, has odd parity, the flags {old$^f$, new$^f$} and counters ($I^f_{old}$ ($\xi$) ... $I^f_{both}$ ($\xi$)} are used.

In block 92, the number of PDFs passing through vertex, v, are determined. The number of PDFs can be determined as the product of the numbers of input subpaths and the number of output subpaths. $F_{old}$ is defined as the number of PDFs passing through vertex, v tested by previous test pattern pairs which is represented by $$F_{old} = I_{old} \times O_{old} \quad (1)$$

$F_{new}$ is defined as the number of PDF's passing through vertex, v, tested by the current test pattern pair which is represented by $$F_{new} = I_{new} \times O_{new} \quad (2)$$

$F_{both}$ is defined as the number of PDFs passing through vertex, v, tested by the previous test pattern pair and the current test pattern pair which is represented as $$F_{both} = I_{both} \times O_{both} \quad (3)$$

Equations (1), (2) and (3) are representative of both rising and falling transitions and are shown without the use of superscripts r and f After block 18 is performed, $F_{split}$ is defined as the number of faults passing through vertex, v that are detected by either the current test pattern pair or the previous test pattern pair. In block 96, $F_{split}$ is determined from the following:

$$F_{split} = F_{old} + F_{new} - F_{both} \quad (4)$$

since $F_{both}$ is accounted for in both $F_{old}$ and $F_{new}$.

$F_{nosplit}$ is defined as the number of faults passing through vertex, v, that are detected by either the current test pattern pair as the previous test pattern pair, if block 20 is not performed. If block 20 is not performed, $F_{new}$ and $F_{old}$ are zero after the edge flags are updated in block 21 since new flags are reset to "false". If the exactness criterion is satisfied for every other vertex in the PSG, the number of input paths and output paths having the old flag set in $F_{nosplit}$ is similar to the number of input and output flags having the old flag set for $F_{split}$. The number of tested faults through vertex, v, without splitting, $F_{nosplit}$ can be represented by $$F_{nosplit} = (I_{old} + I_{new} - I_{both}) \times (O_{old} + O_{new} - O_{both}) \quad (5)$$

In block 98, the error for subpaths in the current iteration is determined by subtracting $F_{split}$ from $F_{nosplit}$ as the following:

$$\in = (I_{old} - I_{both})(O_{new} - O_{both}) + (I_{new} - I_{both})(O_{old} - O_{both}) \geq 0 \quad (6)$$

Error $\in_{new}$ is defined as the error for subpaths in the current iteration. $\in_{new}$ is represented with the following equation separated from equation (6) as:

$$\in_{new} = (I_{old} - I_{both})(O_{new} - O_{both}) \geq 0 \quad (7)$$

$\in_{old}$ is defined as the error for subpaths tested previously with the following equation which is separated from equation (6)

$$\in_{old} = (I_{new} - I_{both})(O_{old} - O_{both}) \geq 0 \quad (8).$$

Figure 6A:
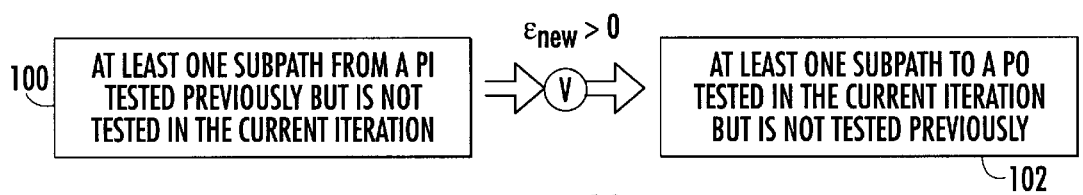
FIG. 6A is a schematic diagram of conditions for new simulation error.
Figure 6B:
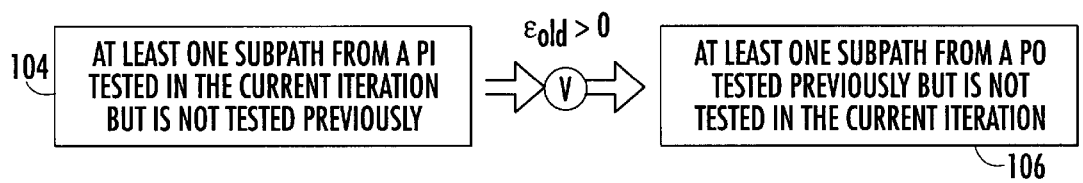
FIG. 6B is a schematic diagram of conditions for old simulation error.

FIG. 6A illustrates the conditions which result in error $\in_{new}$. Error $\in_{new}$ exists if the conditions of block 100 of at least one subpath from a primary input is tested previously but is not tested in this iteration and the condition of block 102 of at least one subpath to a primary output is tested in the current iteration but is not tested previously are present. FIG. 6B illustrates the conditions which result in error $\in_{old}$. Error $\in_{old}$ exists if the conditions of block 104 of at least one primary input is tested in the current iteration but is not tested previously and of block 106 of at least one subpath to a primary output is tested previously but is not tested in the current iteration are present. A new subpath of a PSG has all new flags set and at least one old flag reset. An old subpath has all old flags set and at least one new flag reset.

The exactness criterion is satisfied when both error $\in_{new}$ and error $\in_{old}$ are zero such that:

$$e(v) = e_{old}(v) + \in_{new}(v) = 0 \quad (9)$$

Figure 7:
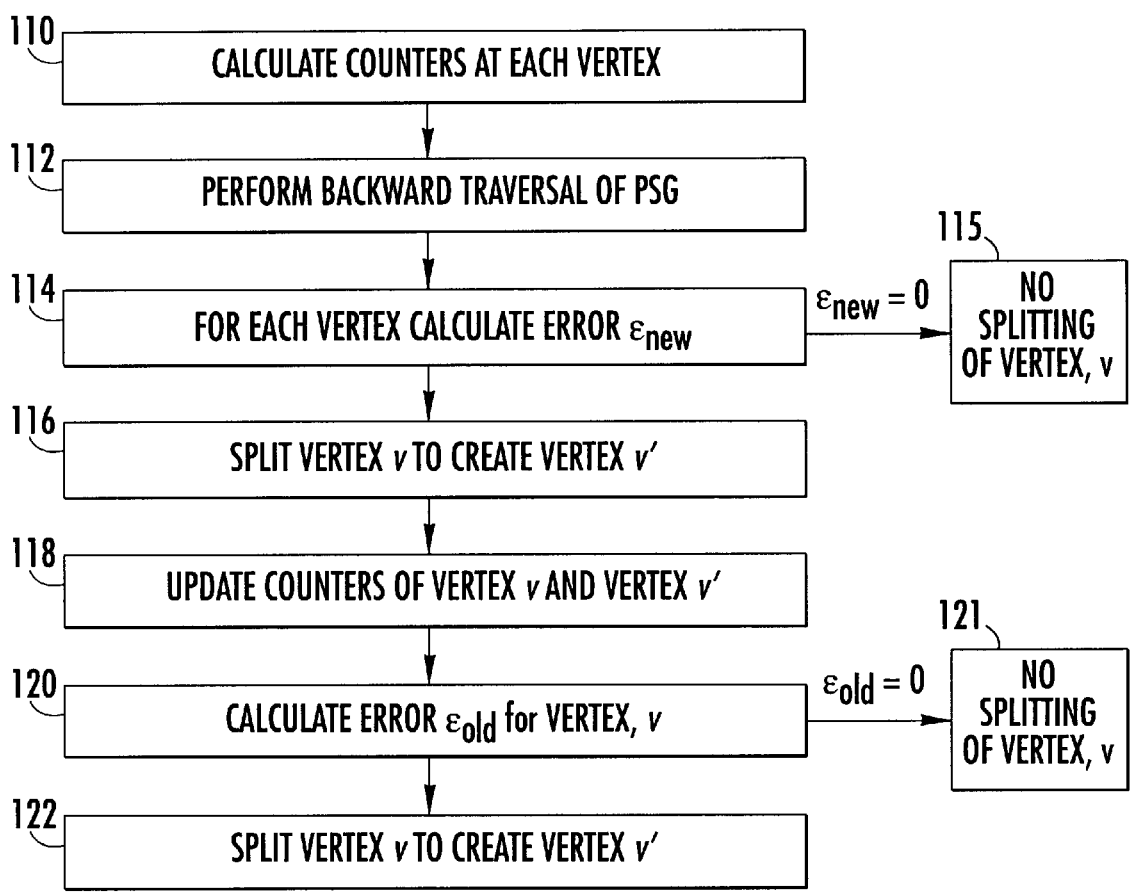
FIG. 7 is a flow diagram of a method for selecting vertices to be split in the PSG.

FIG. 7 illustrates an implementation of block 21 for selectively splitting vertices to eliminate simulation error. Vertices are selected for vertex splitting if the vertex does not satisfy the exactness criterion. A status invariant transformation is determined if the status of a PDF that is tested by previous test pattern pairs, by the current test pattern pair or by the current and previous test pattern pairs remains unchanged. In block 110, counters $I_{old}$, $O_{old}$, $I_{new}$, $O_{new}$, $I_{both}$ and $O_{both}$ are calculated with the steps shown in blocks 90–98 of FIG. 5. A backward traversal of the PSG is performed in block 112 is is done to update the counters of paths tested through each PSG vertex.

In block 114, for each vertex in the PSG error $\in_{new}$ is determined from equation (7). If error $\in_{new}$ is zero, no-splitting of vertex, v, is performed in block 115. If error $\in_{new}$ is nonzero, vertex v is split to create vertex v', in block 116. In block 118, counters $I_{old}$, $O_{old}$, $I_{new}$, $O_{new}$, $I_{both}$ and $O_{both}$ are updated for vertices v and v' with blocks 90–98 of FIG. 5. Vertex v' satisfies the exactness criterion such that after block 118 error $\in_{new}$ (v), error $\in_{new}$ (v') and error $\in_{old}$ (v') are eliminated. Block 120 calculates error $\in_{old}$ for vertex, v. If error $\in_{old}$ is zero, no splitting of vertex v is performed in block 121. If error $\in$ is nonzero, vertex v is split to create vertex, v" in block 122 and counters $I_{old}$, $O_{old}$, $I_{new}$, $O_{new}$, $I_{both}$ and $O_{both}$ are updated with blocks 90–98 of FIG. 5 for vertices v and v" using steps 90–98 of FIG. 5. After block 122 is performed, error $\in_{old}(v)$, error $\in_{old}(v")$ and error $\in_{new}(v")$ are zero and all simulation error is eliminated to maintain exactness of the simulation.

Figure 8:
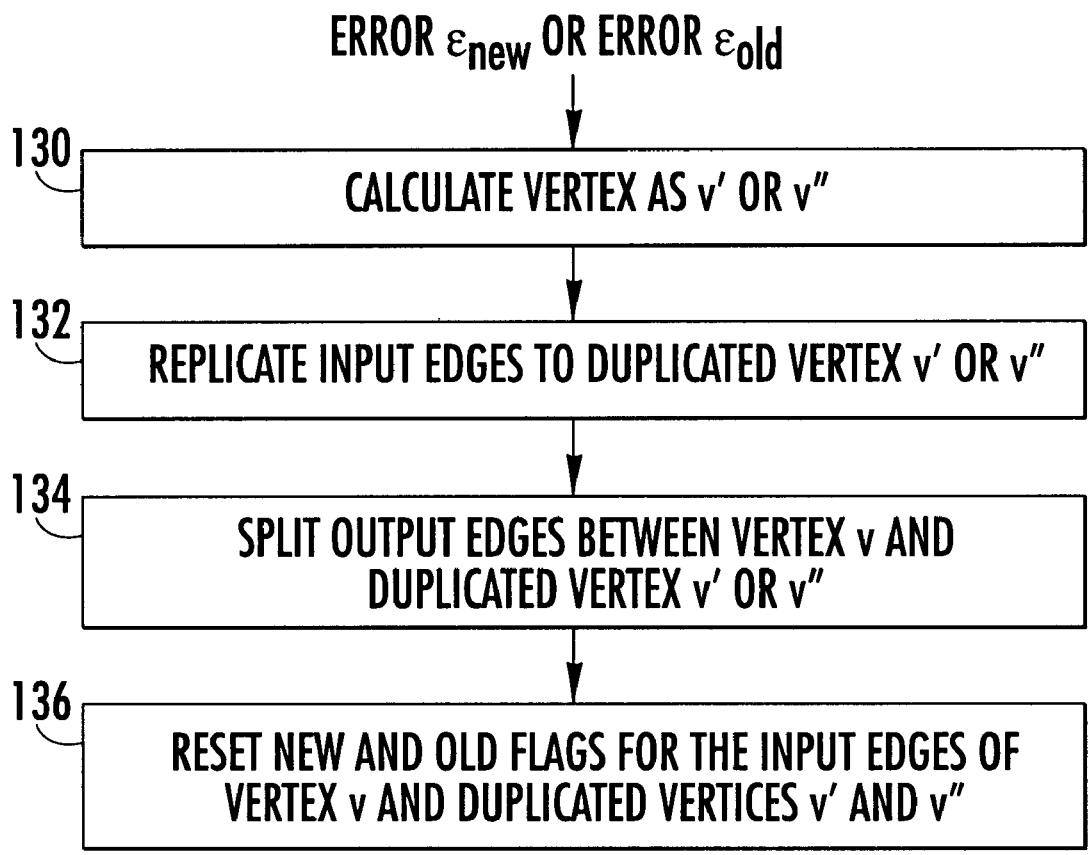
FIG. 8 is a flow diagram of a method for splitting vertices in the PSG.

FIG. 8 illustrates a method for splitting a vertex, v, to eliminate error $\in_{new}(v)$ or error $\in_{old}(v)$ performed in blocks 116 and 122. In block 130, a duplicate vertex v' is created for eliminating error $\in_{new}$ or duplicate vertex v" is created for eliminating error $\in_{old}$. In block 132, if there is an input edge $\xi \rightarrow v$, where $\xi$ has a lower level than vertex v, an input edge is replicated to either vertex v' if vertex v' is created in step 130 or vertex v" if vertex v" is created in step 130, thereby increasing the number of fan-outs for vertex $\xi$. In block 134, output edges are split between vertex v and vertex v' or vertex v". For eliminating error $\in_{new}$, the output edges with new=1 and old=0 are transferred from vertex v to vertex v'. For eliminating error $\xi_{old}$(v') the output edges with new=0 and old=1 are transferred to vertex v".

For example, for eliminating error $\in_{new}$ in an edge $v \rightarrow \xi$, where $\xi$ is a vertex at a higher level than $\xi$, then the source of the edge is changed to vertex $\xi'$ as $v' \rightarrow \xi$ thereby decreasing the number of fan-outs for vertex v. In block 136, new and old flags for input edges of vertex v and vertex v' or vertex v" are reset.

FIG. 4D illustrates the PSG before the steps of FIG. 8 are performed and FIG. 4F illustrates the PSG after the steps of FIG. 8 are performed. The counters for vertex 73 represented by $\{I_{old}, O_{old}, I_{new}, O_{new}, I_{both}$ and $O_{both}\}$ are $\{1, 1, 1, 1, 0, 0\}$. Error $\in_{new}$ is determined from equation (7) as equal to one and error $\in_{old}$ is determined from equation (8) as equal to one. Vertex 82 is created in block 130 and input edges 76 and 80 are replicated to vertices 73 and vertex 82, respectively, in block 132. Output edges 83 and 84 from vertex 72 are split in block 134 between vertex 73 and 82, respectively, in block 134. Flag old is reset on input edge 80 to vertex 82 resulting in a new flag being set on input edge 80 and no flags being set on input edge 83, in block 136. Output edge 78 has new flags equal to "false". In FIG. 4G flag new is reset in input edges resulting in input edge 76 having the old flag set and no flag set on input edge 84. The counters for vertex v are updated to $\{1, 1, 0, 0, 0, 0\}$ and for vertex v' to $\{0, 0, 1, 1, 0, 0\}$. Error $\in_{new}$ is determined from equation (7) as equal to zero for vertex v and vertex v'. Error $\in_{old}$ is determined for vertex, v, from equation (7) as equal to zero. Accordingly, no further splitting is performed in block 20 and PSG of FIG. 4F satisfies the exactness criterion.

Figure 9:
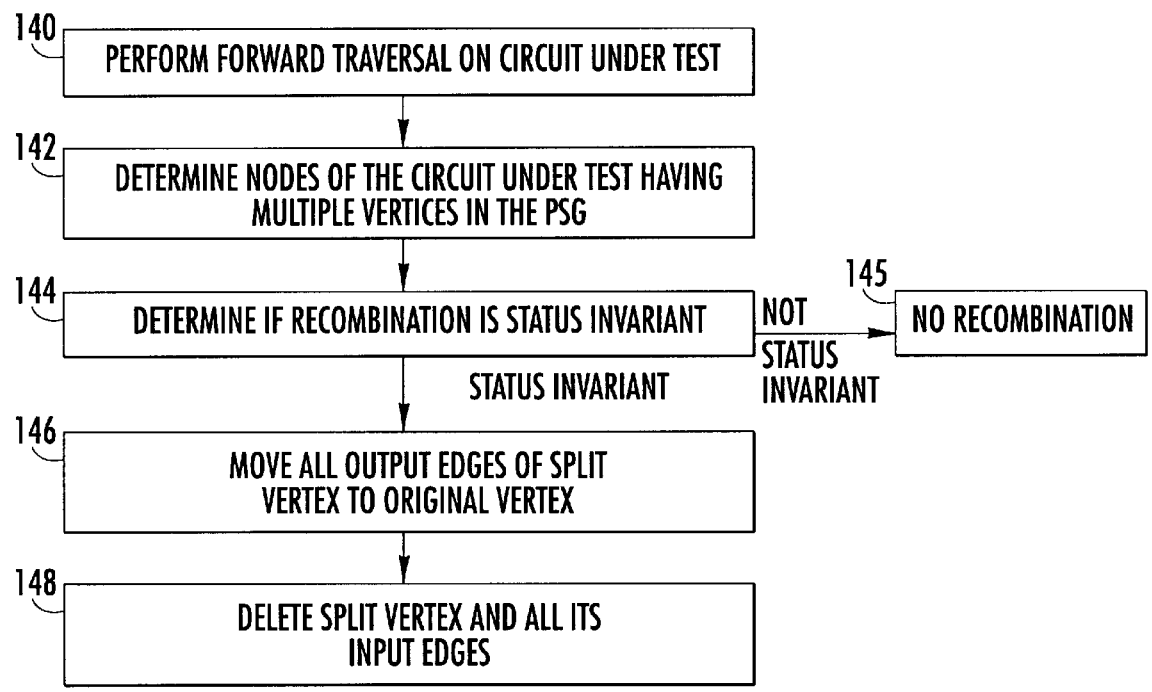
FIG. 9 is a flow diagram of a method for recombining vertices.

FIG. 9 illustrates a method for recombining vertices. In block 140, a forward traversal of the circuit under test is performed. The procedure starts with primary input vertices in the PSG, and follows output PSG edges from the primary input in a breadth first fashion. In block 144, nodes of the circuit are determined as having multiple vertices in the PSG created in block 12. In block 146, it is determined if the recombination of the multiple vertices determined in block 144 is status invariant. The recombination of vertices is status invariant if each pair of the input edges for each of the multiple vertices have the same old$^r$ and old$^f$ flags and have the same source vertex. If the recombination is not status invariant, no recombination is performed in block 145. If the recombination is status invariant, output edges of the split vertex, for example, vertex, v', are moved to the original vertex v, in block 146. In block 148, the split vertex, for example, vertex v', is deleted and all the input edges to the split vertex are deleted. It will be appreciated when the split vertices are recombined a part of the reconverging fan-out structure of the PSG is more efficiently represented. It will also be appreciated that a vertex corresponding to a primary input or primary output is never split. A primary input vertex or a primary output vertex have $I_{new}(v)=I_{old}(v)=I_{both}(v)=1$ from equation (6) error (v)=0 so that the primary input and primary output vertices are never split during simulation. Accordingly, the size of the PSG is smaller than the circuit under test since single fan-out gates are not represented in the PSG.

Figure 10:
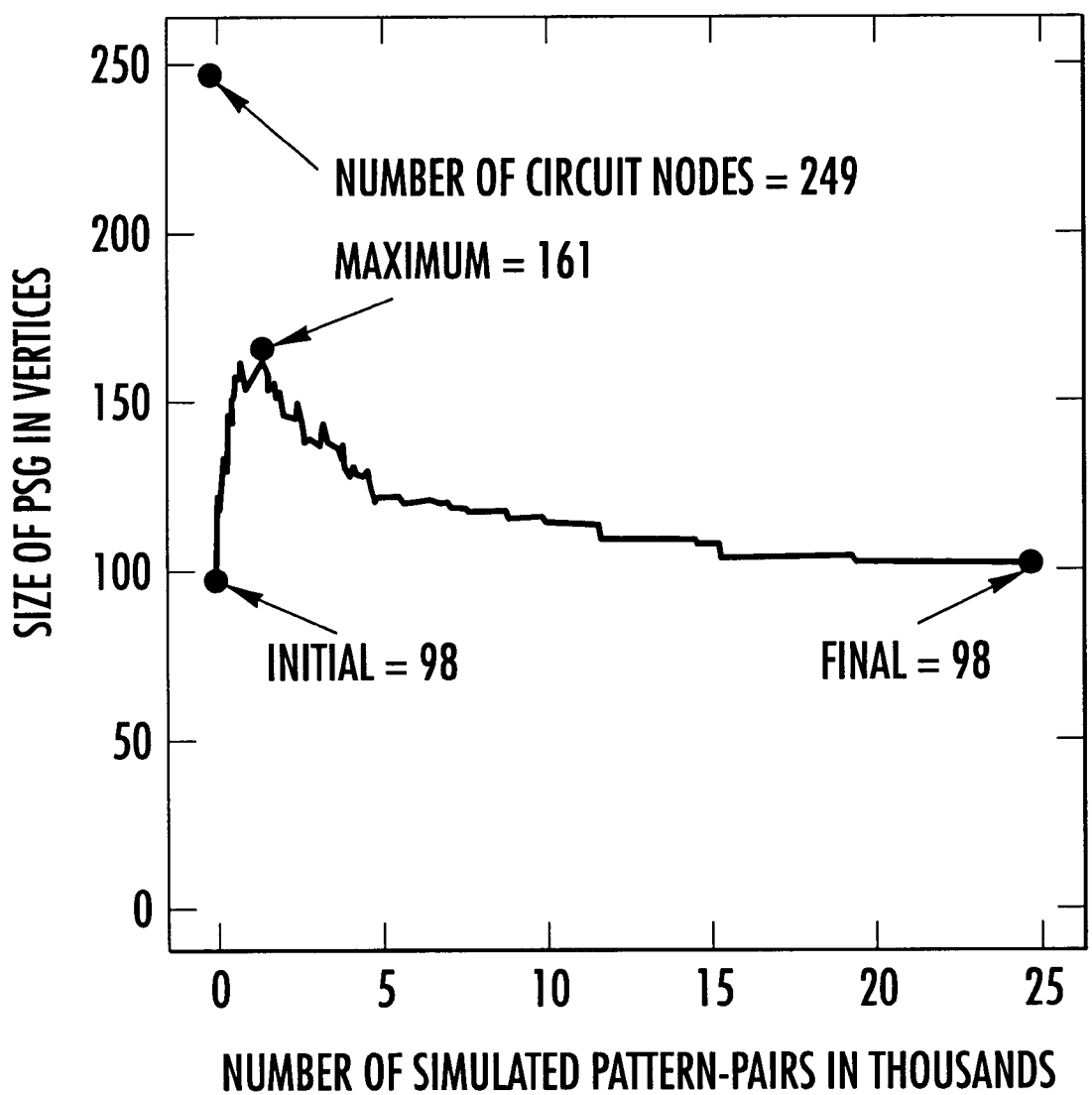
FIG. 10 is a graph of the number of simulated pattern pairs versus the number of vertices in the PSG.

The method of the present invention was implemented in the C programming language and executed on an HP 9000/S735 workstation. The combinational portion of a circuit s510 was simulated using random single input charge (SIC) pattern pairs until 100% PDF coverage was determined. Non-robust fault detection was performed resulting in single fault testability. FIG. 10 represents a plot of the number of simulated pattern-pairs in the thousands versus the number of vertices in the PSG for each SIC pattern pair. Initially, the number of vertices in the PSG is 98,000. The number of vertices in the PSG rises to a maximum of 161,0000. Subsequently, the number of vertices in the PSG decays until it reaches a final value of 98,000. The s510 has been finally tested with the final number of vertices in the PSG equal to the initial number of vertices in the PSG, the $$\text{maximum ratio } \alpha_{\max} = \frac{\text{maximum (size}(PSG))}{\text{size(circuit)}}$$

$$\text{during the course of simulation is } \frac{161}{249} = 0.6.$$

Table 1 shows the results for the combinational portion of circuits s27, s298, s382, s386, s510, s1488 and s1494 from the ISCAS '89 benchmarks, see F. Brglez, D. Bayan and K. Kozminiski, *Combinational Profiles of Sequential Benchmark Circuits,* 1989 International Symposium on Circuits & Systems, IEEE pages 1929–1934, June 1989. The second column shows the total number of PDFs for each circuit. The third column shows $\alpha_{max}$. The fourth column shows the CPU time in seconds. The fifth column shows the total number of PDFs detected using non-robust detection criterion. For each circuit 100% fault efficiency was achieved for non-robust singly testable PDFs.

TABLE 1

Results for ISCAS '89 benchmarks

| Circuit | Total PDFs | $\alpha_{\max}$ | CPU (sec) | Detected PDFs |
|---|---|---|---|---|
| s27 | 56 | 0.9 | 0 | 50 |
| s298 | 462 | 0.5 | 3 | 364 |
| s382 | 800 | 0.7 | 38 | 734 |
| s386 | 414 | 0.2 | 10 | 414 |
| s510 | 738 | 0.6 | 9 | 738 |
| s1488 | 1,924 | 0.3 | 22 | 1,916 |
| s1494 | 1,952 | 0.3 | 22 | 1,927 |

Table 2 shows the results for the combinational portion of circuits c880 c1355, c1098, c2670, c3540, c5315, c6288 and c7552 from the ISCAS '85 benchmarks, see F. Brglez and H. Fujiwara, *A Neutral Net List Of Ten Combinational Benchmark Circuits,* 1985 International Symposium on Circuits and Systems, IEEE, pages 151–158, June 1985. Each circuit is simulated for one thousand single input charge pattern pairs. The number of PDFs detected by the test set in circuit C6288 is on the order of $10^9$. The simulation was completed for all $1.98 \times 10^{20}$ faults leading to the detection of 4.4 billion faults. In comparison, conventional methods of which applicant is aware detect PDFs on the order of $10^6$.

TABLE 2

Results for ISCAS '85 benchmarks

| Circuit | Total PDFs | $\alpha_{max}$ | CPU (sec) | Detected PDFs |
|---|---|---|---|---|
| c880 | 17,284 | 0.8 | 2 | 789 |
| c1355 | 8,346,432 | 1.5 | 2 | 3,435 |
| c1908 | 1,458,112 | 0.7 | 2 | 1,496 |
| c2670 | 1,359,908 | 0.9 | 20 | 3,890 |
| c3540 | 53,206,632 | 1.3 | 8 | 9,980 |
| c5315 | 2,682,610 | 0.7 | 32 | 6,587 |
| c6288 | $1.98 \times 10^{20}$ | 32.1 | 82 | 4,426,256,896 |
| c7552 | 1,452,988 | 0.5 | 30 | 2,499 |

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. A method for identifying tested path-delay faults of an integrated circuit comprising the steps of:

a. creating a path status graph (PSG) for said circuit, said PSG being formed of a plurality of vertices and edges attached to said vertices, said vertices corresponding to at least one node of said circuit, said edges corresponding to paths or subpaths in said circuit between said at least one node of said circuit;

b. detecting a status of at least one said tested path-delay fault with logic simulation of said circuit;

c. dynamically distributing said detected status of said tested path-delay fault of step b to said edges of said PSG;

d. determining if simulation error is present in said PSG determined in step (c);

e. if simulation error is determined in step d, splitting at least one of said vertices in said PSG determined in step (c) for eliminating said simulation error to form an updated PSG; and f. identifying if said status of said tested path-delay fault in step b is correct from backward traversal of said edges in said updated PSG.

2. The method of claim 1 wherein said circuit is a combinational circuit and each of said vertices of said PSG represent either a primary input, a primary output or a gate having more than one fan-out.

3. The method of claim 1 further comprising the step of:

g. recombining said at least one of said vertices split in step e.

4. The method of claim 3 wherein a test pattern pair is used in step b for logic simulation of said tested path-delay fault and steps b through g are repeated for a plurality of test pattern pairs for simulating a plurality of tested path-delay faults.

5. The method of claim 4 wherein in step c said detected status of said at least one tested path-delay fault is held in status flags associated with said edges.

6. The method of claim 5 wherein said status flags are new flags representing tested path-delay faults tested by said test pattern pair applied during a current repetition and old flags representing tested path delay faults tested by said test pattern pair applied during a previous repetition and further comprising the steps of:

h. setting said new flags to true after step g for each edge in said PSG through which there is a detected tested path-delay fault; and i. updating said new flags and said old flags, as old flags, wherein in step f said tested path delay faults are determined from edges having said old flag set to true.

7. The method of claim 6 wherein in step d said simulation error being: error $\in_{new}$ having conditions selected from the group consisting of: at least one subpath from one of said vertices of a primary input of said circuit tested by said test pattern pair applied during a previous repetition and not tested by said test pattern pair applied during a current repetition and at least one subpath to one at said vertices of a primary output of said circuit tested by said test pattern pair applied during a current repetition and not tested by said test pattern pair applied during said previous repetition; and error $\in_{old}$ having conditions selected from the group consisting of: at least one subpath from one of said vertices of said primary input tested by said test pattern pair applied during a current iteration and not tested by said test pattern pair applied during a previous repetition and at least one subpath from one of said vertices of said primary output tested by said test pattern pair applied during a previous repetition and not tested by said pattern pair applied during said current repetition.

8. The method of claim 7 wherein in step d said simulation error is determined from the steps of:

calculating a set of counters, said set of counters are: and $I_{old}$ counter representing the number of subpaths in said circuit starting from one of said vertices of said primary input and ending at one of said vertices of a gate in which all said edges along said subpaths has said old flag set to true after step h; and $O_{old}$ counter representing the number of subpaths in said circuit from said one of said vertices of said gate and ending at one of said vertices of said primary output in which all said edges along said subpaths has said old flag set to true after step h, $I_{new}$ counter representing the number of subpaths in said circuit starting from said one of said vertices of said primary input and ending at said one of said vertices of said gate in which all said edges along said subpaths has said new flag set to true after step h; $O_{new}$ counter representing the number of subpaths in said circuit from said one of said vertices of said gate and ending at said one of said vertices of said primary output in which all said edges along said subpaths has said new flag set to true after step h, $I_{both}$ representing the number of subpaths in said circuit starting from said one of said vertices of said primary input and ending at said one of said vertices of said gate in which all said edges along said subpath has both said old flags and said new flags set to true after step h; $O_{both}$ representing the number of subpaths in said circuit from said one of said vertices of said gate and ending at said one of said vertices of said primary output in which all said edges along said subpaths have said both old flags and new flags set to true after step h;

calculating error $\in_{new}$ from error $\in_{new}=(I_{old}-I_{both})(O_{new}-O_{both})$; and calculating error $\in_{old}$ from error $\in_{old}=(I_{new}-I_{both})(O_{old}-O_{both})$.

9. The method of claim 8 wherein in step e when said calculated error $\in_{new}$ is greater than zero, one of said vertices represented by v is split to create a vertex represented by v' and further comprising the steps of: updating said set of counters at said vertex represented by v and said vertex represented by v' after step f; and calculating said error $\in_{old}$ wherein when said calculated error $\in_{old}$ is greater than zero, said one of said vertices represented by v is split to create a vertex represented by v".

10. The method of claim 9 wherein step e further comprises the steps of:
  duplicating said vertex represented by v';
  replicating edges of input to said vertex represented by v to said vertex represented by v' as edges of input to said vertex represented by v';
  splitting edges of output from said vertex represented by v between said vertex represented by v and said vertex represented by v'; and
  resetting said new and old flags for said edges of input to said vertex represented by v and said edges of input to said vertex represented by v'.

11. The method of claim 9 wherein step e further comprises the steps of:
  duplicating said vertex represented by v";
  replicating said edges of input to said vertex represented by v to said vertex represented by v" as edges of input to said vertex represented by v";
  splitting said edges of output from said vertex represented by v between said vertex represented by v and said vertex represented by v'; and
  resetting said new and old flags for said edges of input to said vertex represented by v and said edges of input to said vertex represented by v".

12. The method of claim 11 wherein step g is performed by the steps of:
  determining if step g is status invariant for said vertex represented by v' or said vertex represented by v",
  moving edges of output of said vertex represented by v' determined as status invariant or said vertex represented by v" determined as status invariant to said vertex represented by v; and
  deleting said vertex represented by v' and said vertex represented by v" from said PSG.

13. The method of claim 1 wherein said logic simulation is performed by applying a simulation algebra to said circuit.

14. The method of claim 13 wherein said simulation algebra is chosen from the group comprising: Chakraborty's 13 valued algebra; Augmented Smith Algebra and Sixteen Valued algebra.

15. The method of claim 1 wherein said path-delay fault is detected based on a detection criteria.

16. The method of claim 15 wherein said detection criteria is a non-robust test.

17. The method of claim 15 wherein said detection criteria is a robust test.

18. The method of claim 1 wherein said circuit is a sequential circuit and each of said vertices of said PSG represent either said primary input, said primary output, a flip-flop input or a flip-flop output.

19. A system for identifying tested delay faults of an integrated circuit comprising:
  means for creating a path status graph (PSG) for said circuit, said PSG being formed of a plurality of vertices and edges attached to said vertices, said vertices corresponding to at least one node of said circuit, said edges corresponding to paths or subpaths in said circuit between said at least one node of said circuit;
  means for detecting a status of at least one tested path-delay fault with logic simulation of said circuit;
  means for dynamically distributing said detected status of said tested path-delay fault to said edges of said PSG;
  means for determining if simulation error is present in said PSG;
  means for splitting at least one of said vertices into an original vertex and at least one split vertex for eliminating said simulation error to form an updated PSG; and
  means for identifying if said detected status of said tested path-delay fault is correct from backward traversal of said updated PSG.

20. The system of claim 19 further comprising:
  means for recombining said at least one of said split vertices with said original vertex.

21. The system of claim 20 wherein a plurality of test pattern pairs are used in said logic simulation for simulating testing of a plurality of path-delay faults.

22. The system of claim 21 wherein said detected status of said at least one tested path-delay fault is held in status flags associated with said edges, said status flags are new flags representing tested path-delay faults tested by said test pattern pair applied during a current repetition and old flags representing tested path-delay faults tested by said test pattern pair applied during a previous repetition and further comprising:
  means for setting said new flags to true for each edge in said PSG through which there is a detected tested path-delay fault; and
  means for updating said new flags and said old flags, as old flags after splitting at least one of said vertices,
  wherein said tested path-delay faults are determined from edges having said old flag set to true.

23. The system of claim 22 wherein said means for splitting comprises:
  means for duplicating said at least one split vertex in said PSG;
  means for replicating edges of input to said at least one split vertex;
  means for splitting edges of output from said original vertex and said split vertex; and
  means for resetting said new flags and said old flags for said edges of input to said original vertex and to said split vertex.

24. The system of claim 23 wherein said means for recombining comprises:
  means for determining if said split vertex is status invariant,
  means for moving edges of output of said split vertex determined as status invariant to said original vertex; and
  means for deleting said split vertex from said PSG.

* * * * *